United States Patent [19]

Hofmann et al.

[11] Patent Number: 4,784,975

[45] Date of Patent: Nov. 15, 1988

[54] POST-OXIDATION ANNEAL OF SILICON DIOXIDE

[75] Inventors: Karl Hofmann, Ulm, Fed. Rep. of Germany; Gary W. Rubloff, Waccabuc; Donald R. Young, Ossining, both of N.Y.

[73] Assignee: International Business Machines Corporation, Armonk, N.Y.

[21] Appl. No.: 922,510

[22] Filed: Oct. 23, 1986

[51] Int. Cl.[4] .......................................... H01L 21/265
[52] U.S. Cl. .............................. 437/247; 148/DIG. 4; 357/91; 156/DIG. 73; 437/238
[58] Field of Search ....... 156/603, DIG. 64, DIG. 73; 148/DIG. 3, DIG. 118, DIG. 4; 427/93, 350; 437/247, 238, 239; 357/91

[56] References Cited

U.S. PATENT DOCUMENTS

| 3,925,107 | 12/1975 | Gdula et al. | 437/247 |
| 4,154,873 | 5/1979 | Hickox et al. | 427/93 |
| 4,214,919 | 7/1980 | Young | 437/247 |
| 4,341,818 | 7/1982 | Adams et al. | 427/350 |
| 4,585,492 | 4/1986 | Weinberg et al. | 148/1.5 |
| 4,626,450 | 12/1986 | Tani et al. | 427/93 |

FOREIGN PATENT DOCUMENTS 51-60453  5/1976  Japan.
55-22862  2/1980  Japan.

OTHER PUBLICATIONS

Montillo et al., "High Temperature Annealing of Oxidized Silicon Surfaces", J. Electrochem. Soc., vol. 118, p. 1463, No. 9, 1971.

Primary Examiner—John Doll
Assistant Examiner—R. Bruce Breneman
Attorney, Agent, or Firm—Pollock, Vande Sande & Priddy

[57] ABSTRACT

The insulating and stabiity characteristics of silicon dioxide gate oxide insulator for field effect transistors are enhanced by subjecting the silicon dioxide to an annealing in an ambient that contains a gaseous oxygen-containing species in an amount sufficient to provide a partial pressure from the oxygen-containing material of about $10^{-6}$ torr to about 10 torr during annealing temperatures of about 500° C. to about 1200° C. Such is carried out for a time sufficient to enhance the insulating and stability characteristics of the silicon dioxide insulator.

14 Claims, 4 Drawing Sheets

POST-OXIDATION ANNEAL OF SILICON DIOXIDE

TECHNICAL FIELD

The present invention is concerned with a process for enhancing the insulating and stability characteristics of silicon dioxide insulators for field-effect transistor semiconductor devices. The present invention is especially concerned with a process for significantly reducing, if not entirely eliminating, low voltage breakdown in silicon dioxide gate oxide insulators, as well as reducing hole-trapping. The objectives of the present invention are achieved by adding oxygen-containing species to the post-oxidation annealing ambient.

BACKGROUND ART

The fabrication of field effect transistor semiconductor devices, such as metal-oxide-semiconductor field effect transistors (MOSFET), requires providing relatively uniform, defect-free silicon dioxide layers on the semiconductor substrate. In order to fabricate high-quality MOSFET devices, it has been necessary to employ a post-oxidation annealing process after growth of the silicon dioxide. Such post-oxidation annealing has generally been carried out in an "inert, oxygen-free" atmosphere such as in nitrogen or argon. These post-oxidation annealing processes are necessary in order to reduce the fixed charge of the formed silicon dioxide layer.

By way of example, annealing in nitrogen or argon at about 1 atmosphere pressure has commonly been carried out in a hot-wall annealing furnace at temperatures of about 900° C. in order to reduce fixed charge densities to achieve proper MOSFET operation. However, these annealing procedures have tended to adversely affect the insulating or dielectric characteristics of the silicon dioxide and the reliability of the silicon dioxide layers over extended periods of time. For instance, post-oxidation annealing in nitrogen or argon atmospheres can result in an increase in breakdown and trapping problems of the silicon dioxide insulator. Such electrical degradation may be associated with the early stages of thermal decomposition of silicon dioxide on silicon at high temperatures. Along these lines, see Tromp, et al., Phys. Rev. Letters 55, 2332 (1985) ard M. Kobayashi, et al., Abstract No. 66 of the Electrochemical Society Spring Meeting, Toronto, 1985 (unpublished), page 94.

These results show that, under vacuum or argon annealing at high temperature, the chemical reaction of silicon dioxide and silicon at high temperature causes oxide decomposition by the generation of a volatile product, silicon monoxide (SiO), leading eventually to the formation of voids completely through the oxide film and finally to complete removal of the oxide.

The consequences of the early stages of this reaction can be severe for the quality of thin insulators and associated devices, such as metal-semiconductor-oxide field effect transistors, because electrical defects will be produced well before the physical deterioration of the oxide (as voids). Two manifestations of electrical defects—low field breakdown and increased hole trapping—have been observed in systematic experimental studies of post-oxidation annealing under oxygen-deficient conditions; other types of electrical degradation may also take place.

Low field breakdown phenomena indicate an inability of the oxide to sustain the electric field which must be applied during device operation. When low field breakdown is a problem, the device will either not operate properly or will fail too soon in its planned lifetime.

When radiation is incident on $SiO_2$, hole and electron pairs are generated in the $SiO_2$. A very high fraction of the electrons leave the $SiO_2$, whereas more holes are trapped at the $Si-SiO_2$ interface. These trapped holes have a positive charge and change the device characteristics. A decrease in the hole trapping rate at the interface enables the device to withstand more radiation before the device characteristics change to an intolerable value.

It has been suggested to ion implant oxygen into silicon dioxide and then to subsequently anneal such in an attempt to reduce surface traps and increase mobility. Moreover, suggestions have been made to employ relatively large quantities of oxygen after post-oxidation annealing in order to increase the oxygen content of the silicon dioxide layer. Furthermore, Japanese Kokai No. 22862 suggests employing relatively high-pressure oxygen in order to provide higher density oxide layers.

Discussions of certain anneal treatments and the effect thereof can be found in Vormen, Appl. Phys. Letters 27, 152 (1975); Balk, et al., Solid State Electronics 27, p. 709 (1984); Montillo, et al., Journal Electrochemical Society, Vol. 118, p. 1463 (1971); and Ray, et al., Journal Electrochemical Society, Vol. 128, p. 2466 (1981).

The procedures suggested in the prior art employ high levels of oxygen and high pressures far above that required to minimize the deleterious effects of inert gas post-oxidation annealing, while in some cases (for example oxygen implantation) they degrade the insulator or substrate quality.

SUMMARY OF INVENTION

The present invention provides a process for enhancing the insulating and stability characteristics of silicon dioxide insulators. In particular, according to the present invention, the low voltage breakdown is at least significantly reduced, if not entirely eliminated, by following the process of the present invention. In addition, the present invention significantly reduces the hole-trapping in silicon dioxide insulator layers.

The process of the present invention includes providing a silicon dioxide layer on a substrate and then subjecting the structure to a high temperature annealing procedure. The annealing includes providing an ambient containing an oxygen-containing species so as to provide a partial pressure from the oxygen-containing species of about $10^{-6}$ torr to about 10 torr during annealing temperatures of about 500° C. to about 1200° C. This annealing procedure is carried out for a time at least sufficient to enhance the insulating and stability characteristics of the silicon dioxide insulator layer.

It is critical in practicing the present invention that the amount of and partial pressure attributable to the oxygen-containing species be between about $10^{-6}$ torr to about 10 torr. For instance, use of amounts of oxygen-containing species significantly greater than that required by the present invention actually results in further oxidation of the wafer, as contrasted to an elimination of the decomposition reaction pursuant to the present invention. Such further oxidation changes the device structure and produces the same oxide defects which post-oxidation annealing is designed to reduce or eliminate.

BEST AND VARIOUS MODES FOR CARRYING OUT THE INVENTION

Figure 1:
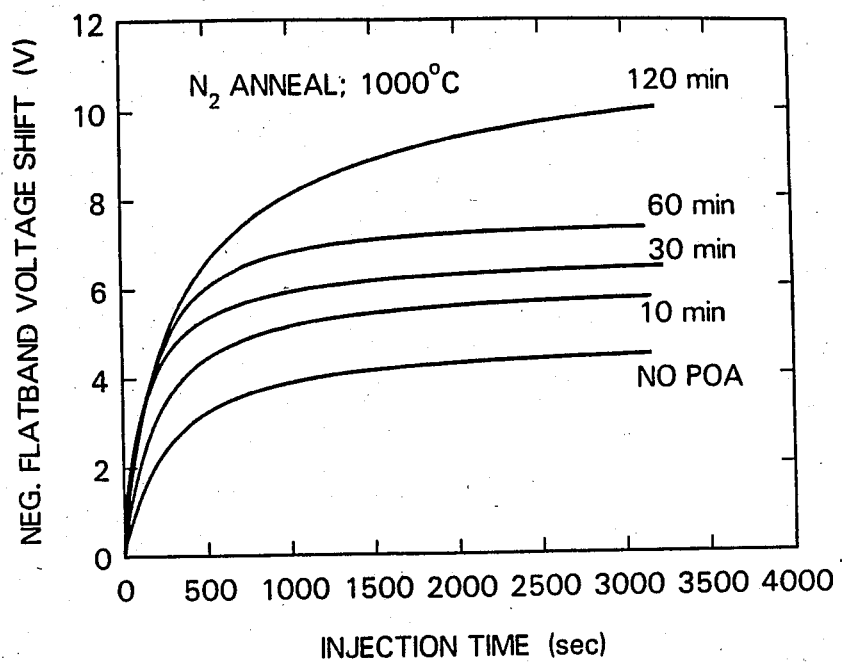
FIGS. 1 and 2 are plots illustrating hole-trapping as a function of hole-injection time under varying conditions.

The present invention includes providing a silicon dioxide layer on a substrate. The substrate can be any suitable substrate material such as glass (e.g., quartz), sapphire, silicon, polycrystalline silicon, metal, or metallized substrate. The preferred substrates materials are silicon and polycrystalline silicon. When the present invention is directed to MOSFET semiconductor devices, the preferred substrate is a p-type or n-type silicon substrate that can have any desired crystal orientation (e.g., <100>). Such can be prepared by slicing and polishing a p-type boule grown in the presence of a n-type dopant such as phosphorus or arsenic, following conventional crystal growth techniques. P-type dopants for silicon include aluminum, boron, gallium, and indium.

The silicon dioxide layer can be provided on the substrate by any of the several known procedures including thermal oxidation of the semiconductor substrate or by well-known vacuum vapor deposition techniques. Moreover, the oxide can be partially or fully recessed into the semiconductor substrate. The silicon dioxide insulator layer is usually about 10 to about 5,000 angstroms thick, preferably about 20 to about 1,000 angstroms thick, and most preferably about 50 to about 250 angstroms thick. The present invention is especially beneficial for treating relatively thin gate insulator oxides (e.g., about 50 to about 250 angstroms thick). Such layers can be provided by thermal oxidation of the silicon substrate at temperatures of about 1000° C. in the presence of dry oxygen, or at about 950° C. under an ambient of oxygen and 4% HCl.

After the silicon dioxide layer is provided on the substrate, such is subjected to a post-oxidation, high-temperature annealing treatment. The temperature of the treatment is usually about 500° C. to about 1200° C., preferably about 600° C. to about 1100° C., and most preferably about 700° C. to about 900° C.

It is essential in practicing the present invention that annealing at the above temperatures be carried out in an ambient that contains an oxygen-containing gaseous species at relatively low concentration. The oxygen-containing material must be in amounts so as to provide a partial pressure from the oxygen-containing species of about $10^{-6}$ torr to about 10 torr. The preferred overpressure due to the oxygen-containing material is about $10^{-1}$ torr to about $10^{-5}$ torr and the most preferred is about $10^{-3}$ torr to about $10^{-5}$ torr. Suitable oxygen-containing species include oxygen, mixtures of oxygen with other gases, and oxygen-containing species that are considered oxidants under the conditions employed such as $H_2O$, $N_2O$, and $H_2O_2$. It is believed that the presence of the oxygen-containing species reverses or prevents the decomposition reaction $$SiO_2 + Si \rightarrow 2SiO \uparrow$$

by reoxidizing the SiO product to reform $SiO_2$.

The post-oxidation annealing procedure of the present invention can be carried out under ultra-high vacuum or under pressure, if desired. In the preferred aspects of the present invention, the annealing is carried out in one atmosphere inert gas ambient under very clean controlled conditions. The furnaces employed are of the type known in the art for post-oxidation annealing and can be modified, if desired, to include an inlet means for delivering the desired quantity of oxygen or oxygen-containing species to the furnace.

The annealing is carried out for a time sufficient to enhance the insulating and stability characteristics of the silicon dioxide insulator and generally is about 1 second for rapid thermal processing to about 120 minutes for furnace annealing. For rapid thermal processing, the time is usually about 1 second to about 15 minutes. For other less rapid processes, the time is usually about 5 minutes to about 120 minutes and preferably about 30 to about 90 minutes.

As can be appreciated, the addition of the required oxygen or oxygen-containing species during post-oxidation annealing may be accomplished in a variety of ways.

As discussed above, the preferred manner involves adding molecular oxygen ($O_2$) to the ambient in a one-atmosphere furnace, such as used for post-oxidation annealing or as the post-oxidation annealing step as carried out after oxidation in the oxidation furnace itself. The oxygen gas is admitted through a controlled, variable rate leak valve such as to achieve sufficient oxygen concentration that degradation of electrical characteristics (such as breakdown and trapping) is prevented. The added oxygen is present through the complete post-oxidation annealing process.

Alternatively, the post-oxidation annealing with a small amount of additional oxygen present may be carried out in a reduced pressure environment, such as a low-pressure chemical vapor deposition system or a vacuum or ultrahigh vacuum chamber.

In another procedure, the post-oxidation annealing with a small amount of additional oxygen present may be carried out in a rapid thermal annealing system either at one atmosphere or at reduced pressure.

In a still further procedure, the post-oxidation annealing with a small amount of additional oxygen present may be carried out using a mixed gas source in the annealing furnace. One example of this procedure is with oxygen at low partial pressure mixed with an inert gas (argon, nitrogen, etc.) such as to have a total pressure of one atmosphere (or below). The amount of oxygen being sufficient to accomplish the desired electrical quality and reliability improvements.

In another procedure, the post-oxidation annealing may be carried out by supplying an oxygen-containing gaseous species other than molecular oxygen ($O_2$). Examples of such alternative oxygen-containing species include, but are not limited to, water ($H_2O$), nitrous oxide ($N_2O$), ozone ($O_3$) and hydrogen peroxide ($H_2O_2$).

In another procedure, the post-oxidation annealing may present the oxygen-containing species at low concentration during part but not all of the post-oxidation annealing cycle. For example, the oxygen might be added at the end of the post-oxidation annealing cycle rather than being present during the complete cycle. The post-oxidation anneal can be carried out after oxidation in the oxidation furnace or in a separate post-oxidation annealing furnace.

The following non-limiting Example is presented to further illustrate the present invention:

EXAMPLE 1

Structures are fabricated from phosphorus-doped p-type silicon substrate having resistivity of about 0.085 to about 0.115 ohm/centimeter and being Czochralski grown (<100>) oriented wafers. Slabs of an area of about $5 \times 25$ mm$^{-2}$ are cut from the wafers. The slabs are then chemically cleaned. Next, silicon dioxide films of about 500 angstroms thickness are grown on the substrate at temperature of about 1000° C. in an ultra-dry oxygen process as disclosed by Lai, et al., Journal of Applied Physics, Vol. 52, p. 5691 (1981).

The wafers are subjected to post-oxidation annealing under ultra-high vacuum system. The samples are supported in the ultra-high vacuum chamber by tantalum clamps that provide electrical contacts to both ends of the silicon. AC current is passed through the samples to accomplish direct resistive heating. The sample temperature during annealing is measured using an optical pyrometer calibrated against a thermocouple. The samples are subjected to the various annealing conditions illustrated in FIGS. 1 to 5. In order to reduce any effect of prolonged exposure of the samples to the laboratory ambient, the annealing in the ultra-high vacuum chamber is carried out within 8 hours after the oxidation. The annealing procedures in the vacuum (residual pressure of about $5 \times 10^{-9}$ torr) and in oxygen at the various partial pressures shown are carried out in an ultra-high vacuum system at temperatures of about 750° C. to about 900° C. The desired O$_2$ pressure is stabilized by adjusting a leak valve for the O$_2$ gas (99.98%) inlet and a valve to the pumping unit. The samples are annealed for about 1 hour using the direct resistive heating and cooled in the annealing ambient.

After the annealing, aluminum gate MOS capacitors are fabricated. Aluminum dots of about $5.2 \times 10^{-2}$ cm in diameter and about 2,000 angstroms in thickness are evaporated from a radio frequency-heated boron nitride crucible. The back oxide is etched and gallium/indium paste is used for electrical contact to the substrate.

The hole-trapping in the annealed silicon dioxide films is studied by injection of avalanche-generated holes from the n-type substrate. The avalanche-technique is described in Nicollian, et al., Applied Physics Letters, Vol. 15, p. 174 (1969) and the experimental set-up employed is described by Young, et al., Journal of Applied Physics, Vol. 50, p. 6366 (1979). This technique relies upon the generation of holes with sufficient energy to surmount the oxide barrier at the interface by application of a depletion pulse to the gate electrode. A 30 kilohertz saw-tooth wave form is used for the depletion pulse. The measurements are taken for identical experimental conditions with an average injection current density of about $3.8 \times 10^{-9}$ A/cm$^2$. The time-dependent shift in the flat band voltage (V$_{FB}$ Ct) is related to the trap charge (Q$_T$(t))

$$Q_T(t) = -C_{ox}/d_{ox} X \Delta V_{FB}(t)$$

wherein C$_{ox}$ is the oxide capacitance, d$_{ox}$ is the oxide thickness, and X is the distance of the charge centroid from the metal-oxide interface. A negative flat band voltage shift indicates trapping of positive charge in the oxide. The injection is interrupted after selected time intervals and the shift in the flat band voltage is automatically measured. In addition, high-frequency CV and quasi-static capacitance voltage (CV) measurements are performed to check the quality of the sample.

Reference to FIG. 1 illustrates the behavior of the hole-trapping as a function of a conventional post-oxidation anneal in a 1 atmosphere nitrogen furnace. With no post-oxidation anneal there is a notable amount of hole-trapping (increase in negative flat band voltage shift). This is likely due to the fact that the termination of the oxidation process (switch from the oxygen to the nitrogen followed by the cooling) already involves about 10 minutes of high-temperature annealing in an oxygen-deficient ambient. Post-oxidation annealing in a 1 atmosphere nitrogen increases the hole-trapping somewhat and, as the temperature increases, the hole-trapping also becomes larger.

Figure 2:
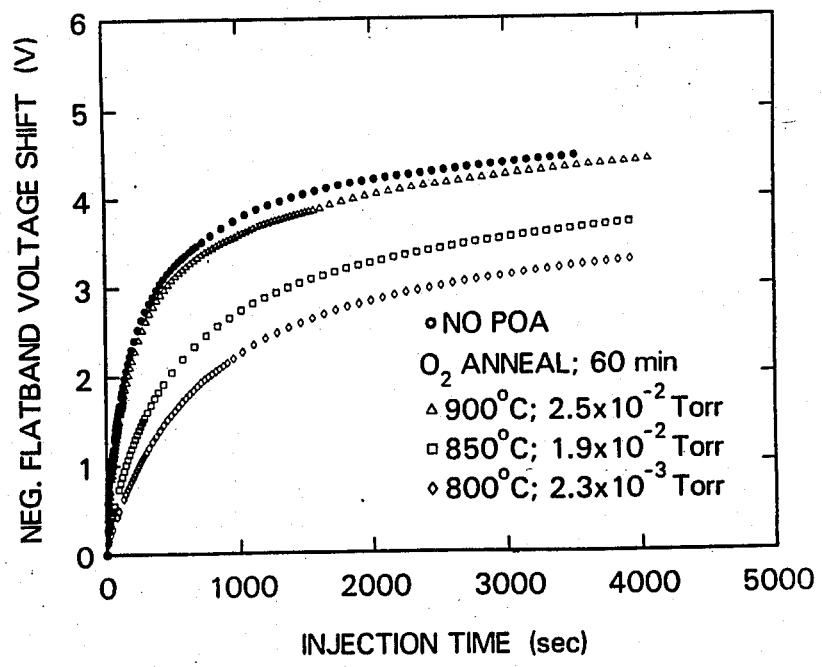

As illustrated in FIG. 2, the increase in hole-trapping is reversed by incorporating the proper amounts of oxygen during the post-oxidation annealing procedure.

Figure 3:
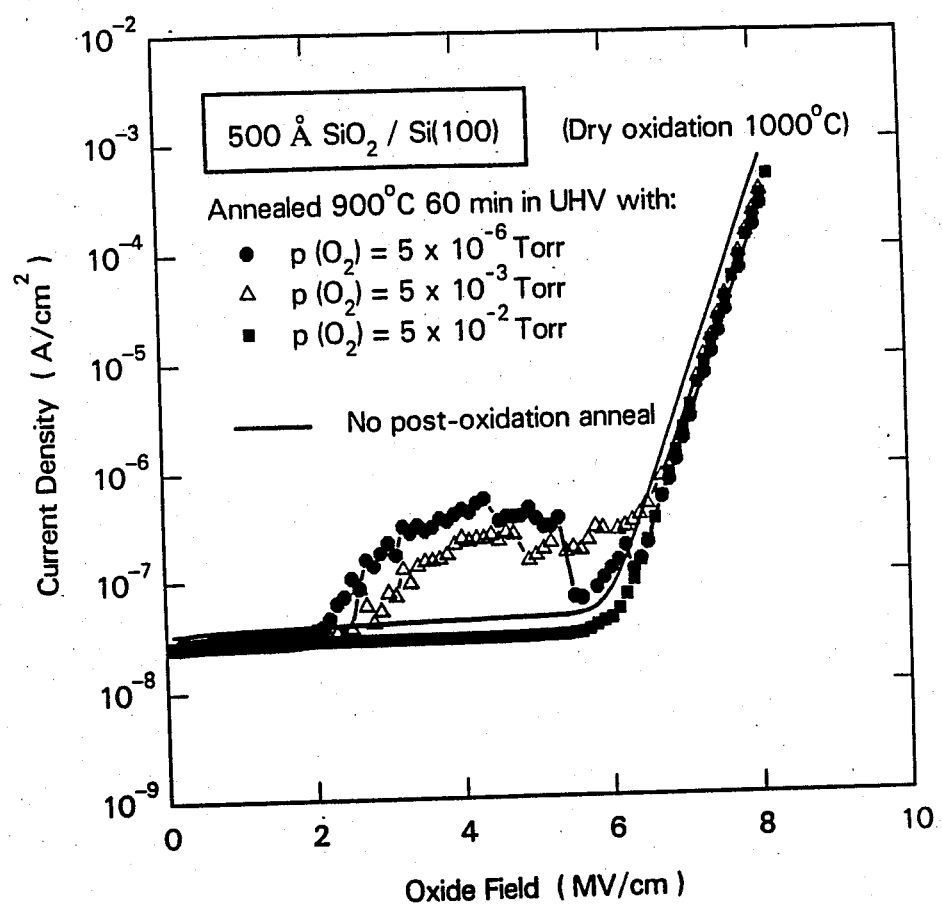
FIGS. 3 and 4 illustrate low voltage breakdown under varying conditions.
Figure 4:
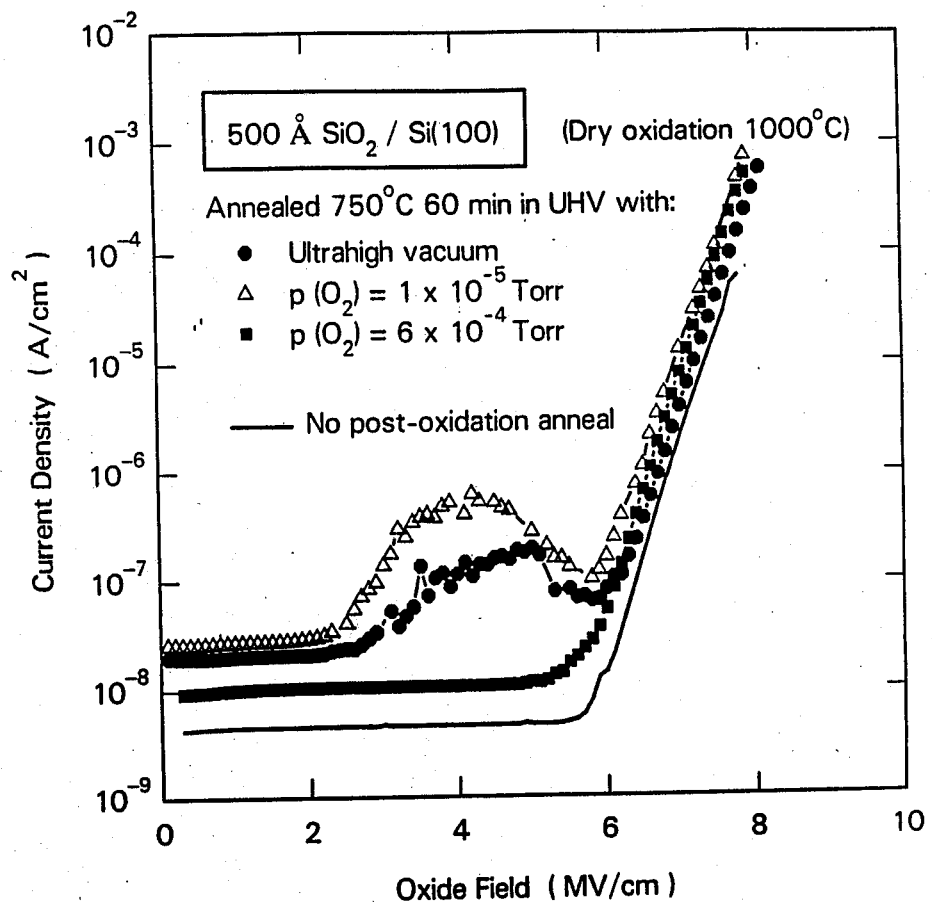

Reference to FIGS. 3 and 4 illustrates the effect of the oxygen concentration during the post-oxidation annealing procedure on low-field breakdown characteristics. For instance, as apparent from the ramp IV measurements for 750° C. and 900° C. post-oxidation annealing, low-field breakdown (in the 2-6 MV/cm range) is not observed without post-oxidation annealing. However, with post-oxidation annealing in vacuum or with small amounts of oxygen present, low-field breakdown is observed. Sufficient oxygen partial pressure, however, during the annealing, prevents this breakdown as illustrated in FIGS. 3 and 4.

Figure 5:
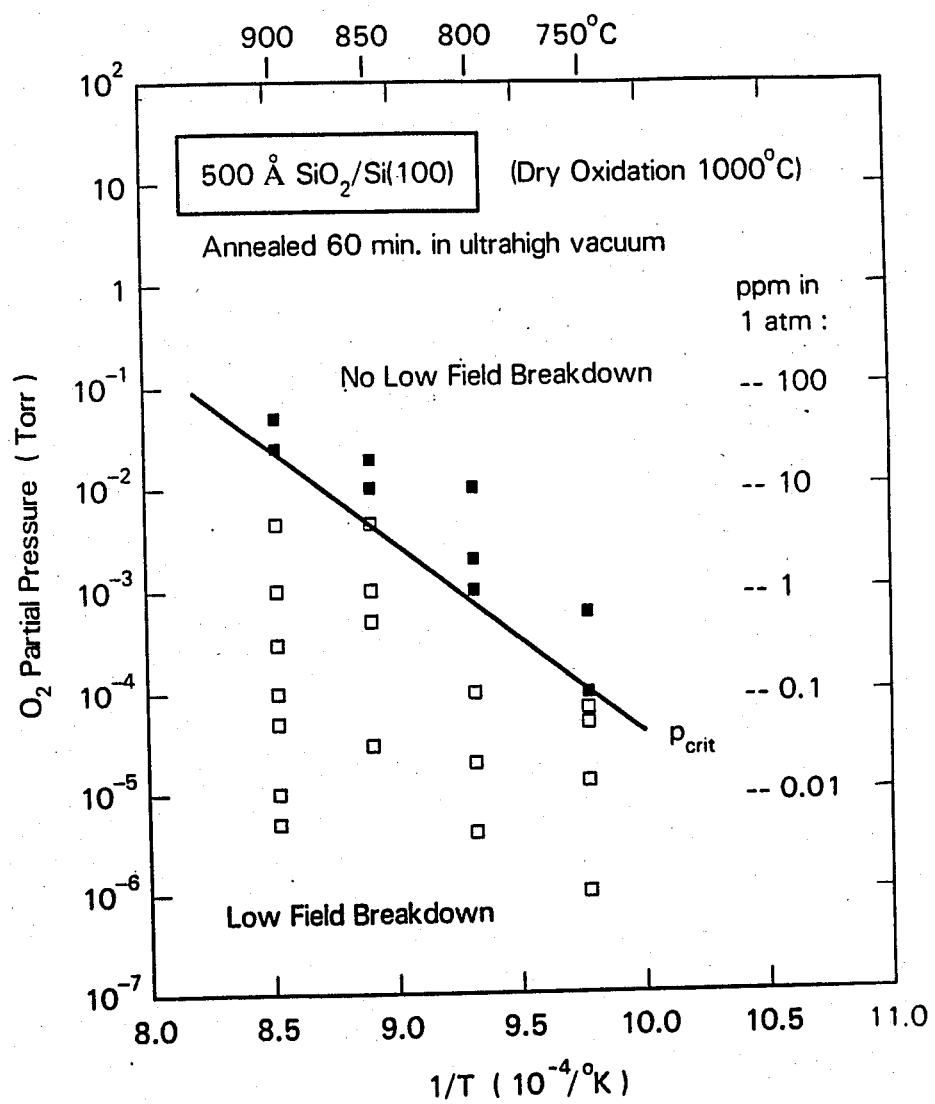
FIG. 5 is a plot of pressure and temperature relationship for measurements of low field breakdown under varying conditions.

Reference to FIG. 5 shows the relation of temperature and pressure parameters with respect to low-field breakdown. In FIG. 5, the open symbols indicate that low-field breakdown occurs, while solid symbols represent cases where such breakdown is not observed. Annealing in ultra-high vacuum, an environment highly devoid of oxygen residual gas, produces low-field breakdown. Annealing in sufficiently pure (oxygen-deficient) nitrogen or argon, likewise, results in low-field electrical breakdown. On the other hand, as shown, annealing in low partial pressures of oxygen, as required by the present invention, results in no low field electrical breakdown, depending upon whether sufficient oxygen partial pressure is employed during the post-oxidation annealing at any given temperature.

FIG. 5 illustrates testing over a wide range of pressure and temperature conditions (see the spread of data prints in FIG. 5). The boundary between the absence and presence of low field breakdown problems is quite clearly indicated and precisely defined by the region (shown by the p$_{crit}$ line) separating solid points (no low field breakdown) from open points (low field breakdown occurs).

Similar behavior can be achieved using inert gas post-oxidation annealing at one atmosphere total pressure. For instance, initial observations show that purer [more oxygen-free) annealing ambients yield less low field breakdown and trapping. Conversion of the partial pressures of oxygen in FIG. 5 to oxygen concentrations relative to a one-atmosphere ambient are shown by ppm (parts-per-million) bars on the right in FIG. 5. These represent an estimate of the amount of oxygen which should be present in the one-atmosphere post-oxidation annealing ambient to prevent electrical degradation.

As apparent from FIG. 5, as the temperature increases the required partial pressure of the oxygen also must increase in order to achieve the benefits of the present invention. However, persons skilled in the art, aware of the present specification, can determine without undue experimentation the particular partial pressure to employ for a particular annealing temperature and silicon dioxide thickness. For the systems treated of a 500 angstrom thick silicon dioxide layer, the following temperatures and pressures provide for prevention of low voltage electrical breakdown:

| T°(c)       | 750                | 800                | 850                | 900                |
|-------------|--------------------|--------------------|--------------------|--------------------|
| $P(O_2)$(torr) | $5 \times 10^{-4}$ | $5 \times 10^{-3}$ | $2 \times 10^{-2}$ | $8 \times 10^{-2}$ |
| $C(O_2)$(ppm)  | 0.5                | 5                  | 20                 | 80                 |

Having thus described our invention, what we claim as new and desire to secure by Letters Patent is:

1. A process for enhancing the insulating and stability characteristics of $SiO_2$ insulator for a field-effect transistor semiconductor device which comprises providing a silicon dioxide layer on a substrate, and then annealing; wherein the annealing includes providing an ambient containing gaseous oxygen-containing species is at least one member selected from the group consisting of oxygen, ozone, nitrous oxide, and hydrogen peroxide to provide a partial pressure from said oxygen-containing species of about $10^{-6}$ torr to about $2 \times 10^{-2}$ torr during annealing temperatures of about 600° C. to about 1100° C. for a time sufficient to enhance the insulating and stability characteristics of said $SiO_2$ insulator.

2. The process of claim 1 wherein said partial pressure is about $2 \times 10^{-2}$ torr to about $10^{-5}$ torr.

3. The process of claim 1 wherein said partial pressure is about $10^{-3}$ torr to about $10^{-5}$ torr.

4. The process of claim 1 wherein said temperature is about 700° C. to about 900° C.

5. The process of claim 1 wherein the time is about 1 second to about 120 minutes.

6. The process of claim 1 wherein the time is about 1 second to about 15 minutes.

7. The process of claim 1 wherein the time is about 5 minutes to about 120 minutes.

8. The process of claim 1 wherein the time is about 30 minutes to about 90 minutes.

9. The process of claim 1 wherein said silicon dioxide is about 10 to about 5,000 angstroms thick.

10. The process of claim 1 wherein said silicon dioxide is about 20 to about 1,000 angstroms thick.

11. The process of claim 1 wherein said silicon dioxide is about 50 to about 250 angstroms thick.

12. The process of claim 1 wherein said oxygen-containing species is molecular oxygen.

13. The process of claim 13 wherein the pressure of said annealing is about 1 atmosphere.

14. The process of claim 1 wherein said annealing does not result in oxidation of said substrate.

* * * * *